(12) United States Patent
Ouyang

(10) Patent No.: US 7,562,533 B2
(45) Date of Patent: Jul. 21, 2009

(54) THERMAL-ELECTRIC-MHD COOLING

(75) Inventor: Chien Ouyang, San Jose, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 409 days.

(21) Appl. No.: 11/487,934

(22) Filed: Jul. 17, 2006

(65) Prior Publication Data

US 2008/0010998 A1    Jan. 17, 2008

(51) Int. Cl.
F25B 21/02    (2006.01)

(52) U.S. Cl. ............................................ 62/3.7; 62/3.2

(58) Field of Classification Search ................ 62/1–3.3, 62/3.7, 430–434, 3.6, 457.9, 407; 165/121; 257/714; 136/204
See application file for complete search history.

(56) References Cited

U.S. PATENT DOCUMENTS

| | | | | |
|---|---|---|---|---|
| 3,205,667 | A * | 9/1965 | Frantti | 136/204 |
| 5,564,276 | A * | 10/1996 | Abadilla et al. | 62/3.7 |
| 6,334,311 | B1 * | 1/2002 | Kim et al. | 62/3.2 |
| 6,557,354 | B1 * | 5/2003 | Chu et al. | 62/3.2 |
| 6,658,861 | B1 * | 12/2003 | Ghoshal et al. | 62/3.7 |
| 6,766,817 | B2 | 7/2004 | da Silva et al. | |
| 6,918,404 | B2 | 7/2005 | Dias da Silva et al. | |
| 7,066,586 | B2 | 6/2006 | da Silva et al. | |
| 7,293,416 | B2 * | 11/2007 | Ghoshal | 62/3.7 |
| 2003/0033818 | A1 * | 2/2003 | Kucherov et al. | 62/3.1 |
| 2004/0182088 | A1 * | 9/2004 | Ghoshal et al. | 62/3.7 |
| 2006/0137361 | A1 * | 6/2006 | Ghoshal | 62/3.7 |

OTHER PUBLICATIONS

Warren M. Rohsenow et al. Handbook of Heat Transfer, 1998, McGraw-Hill, Third edition, 1.2-1.4.*

* cited by examiner

*Primary Examiner*—Frantz F Jules
*Assistant Examiner*—Cassey Bauer
(74) *Attorney, Agent, or Firm*—Osha • Liang LLP

(57) ABSTRACT

A method for transferring heat from a first location to a second location includes thermoelelectrically transferring heat from the first location to a third location; and transferring heat from the third location to the second location through a magneto-hydrodynamic (MHD) flow. A cooling system includes a thermoelectric cooling (TEC) component; and a magnetohydrodynamic (MHD) component, wherein the MHD component and the TEC component are in thermal contact.

11 Claims, 12 Drawing Sheets

HEAT SOURCES

ATTACHED TO HEAT SOURCES

ATTACHED TO HEAT SOURCES

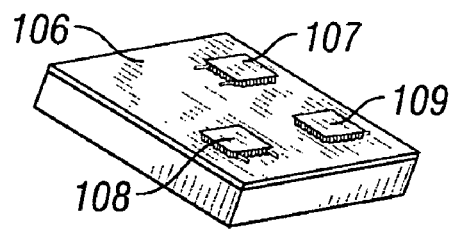
FIG. 10B
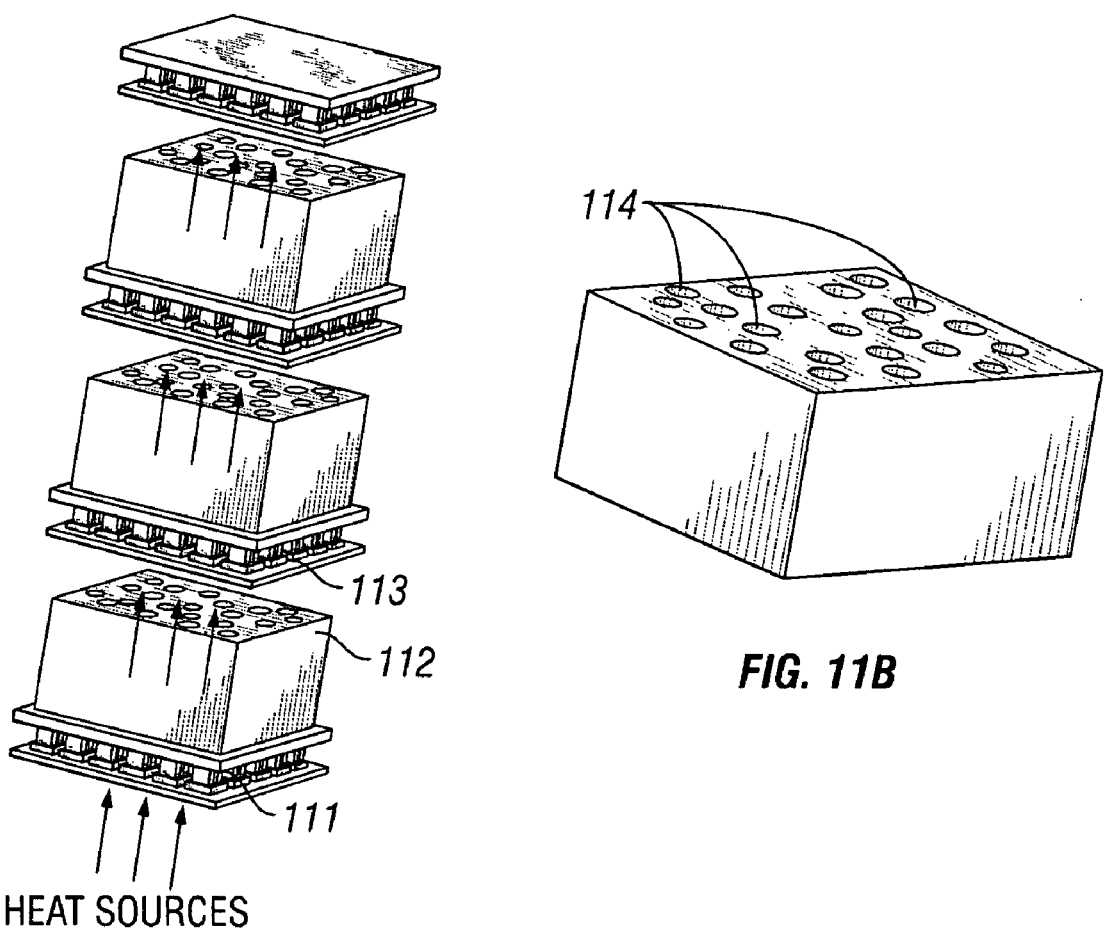
HEAT SOURCES
FIG. 11A
FIG. 11B

USE TWO INDEPENDENT SOURCES

THERMAL-ELECTRIC-MHD COOLING

BACKGROUND OF INVENTION

Thermoelectric cooling (TEC) system is advantageous over conventional refrigerating system in many aspects, such as being more compact and involving only solid-state components. The basic concept behind TEC is the Peltier effect, which occurs when electric current flows through two dissimilar materials. Depending on the current flow direction, cooling or heating could occur at the junction between the two dissimilar materials.

The Peltier effect may be understood using an energy band diagram as illustrated in FIG. 1. Two dissimilar materials I and II have different energy levels. When the two materials are in contact, a conduction band discontinuity $\Delta E_c$ may be formed at the junction. When an electric field is applied to the material system, the conduction band energy level for electrons is slanted, as shown in FIG. 1, in a direction opposite to the electric field direction.

Electrons in a material have a distribution of kinetic energy following certain statistics. The temperature of the material may be characterized by an average kinetic energy of electrons in the material. An electron (e⁻), driven by the electric field, tends to move along the slanted direction of the conduction band. To cross the junction, the electron would have to overcome the potential energy barrier $\Delta E_c$. Consequently, among all the electrons, those of higher kinetic energy, i.e., contributing more to the temperature, have higher probability of crossing the junction.

Because higher-energy electrons selectively cross the junction and leave material I, the average energy of the electrons left in material I near the junction is effectively lowered, resulting in a cooling near the junction between materials I and II. When the electrons cross the second junction between materials II and III, the average kinetic energy of electrons in material III near the second junction becomes higher, so does the temperature near the junction. Thus, applying an electric field across the material system shown in FIG. 1 effectively transfers heat in the direction of the electron motion, from the first junction to the second junction.

Among the materials used for TEC technologies, Bismuth Telluride is the most widely used because it can be more easily optimized for pumping heat. In addition, because Bismuth Telluride is a semiconductor, it can be easily doped to be either n-type (electron conducting) or p-type (hole conducting). The simplest TEC module can be constructed using a single semiconductor "pellet," which is soldered to electrically-conductive materials on each end. The electrically-conductive material used is usually plated copper. In this configuration, materials I and III are, in fact, the copper connection paths to the power supply. Such a simple TEC module is illustrated in FIG. 2A. When operating the TEC module of FIG. 2A, electrons flow in the wire 21 in the direction shown by the arrows, driven by the electric field from the DC voltage source 22. When electrons cross the junction between the copper plate 23 and the n-type semiconductor pellet, heat is absorbed at the junction. When the electrons cross the junction of the opposite side, heat is released. Note that the heat transfer direction in the n-type module is along the electron motion direction, which is opposite to the electrical current direction.

Similar to the n-type TEC module shown in FIG. 2A, FIG. 2B illustrates a p-type TEC module. The same or a different power supply 22 may be used to drive an electrical current originating from the "+" terminal of the voltage source, through the wire 25 to the copper plate 23. In the p-type pellet 26, the electrical current is carried by holes. Note that in the p-type TEC module heat transfer is in the direction of the motion of holes, which is the same as the electrical current direction. Such a property, resulting from the fact that electrons and holes have opposite charges, is advantageously used in building a practical TEC device as shown in FIG. 3A, wherein a plurality of n-type modules 31, 33, and 35, and p-type modules 32, 34, and 36 are electrically connected in series, while heat is pumped in a direction parallel to the arrangement of the modules. The heat transfer direction is the direction of the electron flow direction, which is the same as the hole flow direction.

As illustrated in FIG. 3B, a conventional TEC device consists of 254 alternating p-type pellets 32 and n-type pellets 31 arranged in a 2-D array. The pellets (modules) are paired and electrically connected using copper plates 37. The array is usually disposed between ceramic substrates 38 and 38'. The heat transfer direction is indicated by array 39. Such a device can be driven with a 12-16 V DC power supply and draws a current of 4-5 amps.

The compact design of the multiple pellets results in a high efficiency for heating from the cold side to the hot side. Subsequently, the temperature of the hot side increases and heat dissipation in the hot side must be taken into account when designing a practical TEC system.

SUMMARY OF INVENTION

In one aspect, embodiments disclosed herein relate to a method for transferring heat from a first location to a second location, including thermoelectrically transferring heat from the first location to a third location, and transferring heat from the third location to the second location through an MHD flow.

In another aspect, embodiments disclosed herein relate to a cooling system including a TEC component and an MHD component, wherein the TEC component and the MHD component are in thermal contact.

Other aspects and advantages of the invention will become apparent from the following description and the attached claims.

BRIEF SUMMARY OF THE DRAWINGS

FIGS. 10A-10B shows a cooling system including a large-area MND cooling component in accordance with embodiments of the present invention.

FIG. 11A-11C illustrates a stacked cooling system including multiple TEC and MHD components and vertical fluid channels in accordance with embodiments of the present invention.

DETAILED DESCRIPTION

In one aspect, some embodiments disclosed herein relate to methods and systems for effectively transferring heat at a controlled rate to a desired location. In particular, embodiments of the present invention relate to methods and systems utilizing magnetohydrodynamic (MHD) cooling means as well as TEC means to transfer heat. The TEC means for transferring heat involves using the Peltier effect by sending electrical current to a TEC component. The MHD means for transferring heat involves magnetically driving a fluid that carries heat.

A system in accordance with an embodiment of the present invention may include some or all of the following components: (1) a TEC component; (2) a heat sink component; (3) an MHD cooling component; (4) a power supply; and (5) a control component.

MHD technologies have been extensively utilized in the fields of, for example, plasma confinement, liquid-metal cooling of nuclear reactors, and electromagnetic casting. The operation principle of an MHD device is based on the interaction between a moving charged particle and a magnetic field, where the particle is propelled in a direction perpendicular to the magnetic field direction and to its moving (electric current) direction.

Practical MHD devices have been described in, for example, "Theory of the Laminar Flow of an Electrically Conductive Liquid in a Homogeneous Magnetic Field," by Julian Hartmann in 1937, wherein electromagnetic pumping of liquid metals is explained in detail. MHD devices have also been used in controlling flows of liquid metals in metallurgical processing, through stirring and levitating the liquids (see, e.g., A. F., Kolesnichenko, "Electromagnetic Processes in Liquid Material in the USSR and Eastern European Countries," Iron and Steel Institute of Japan (ISIJ) 30 (1), 8-26, 1990). Besides liquid-phase MHD devices, gas-phase MHD devices have been used in power generation. Gas-phase MHD technologies have the potential to improve electric conversion efficiency, increase system reliability by eliminating mechanical moving parts, and reduce emissions (see, e.g., P. Sporn and A. Kantrowitz, "Magnetohydrodynamics: Future Power Process?" Power 103 (11), November 1959, 62-65; and L. Steg & G. W. Sutton, "Prospects of MHD Power Generation," Astronautics, 5, Aug. 1960, 22-25). Closed-cyle liquid metal MHD systems using both single-phase and two-phase flows have also been explored.

Embodiments of the present invention are described in detail below with respect to the drawings. Like reference numbers are used to denote like parts throughout the figures.

Figure 4:
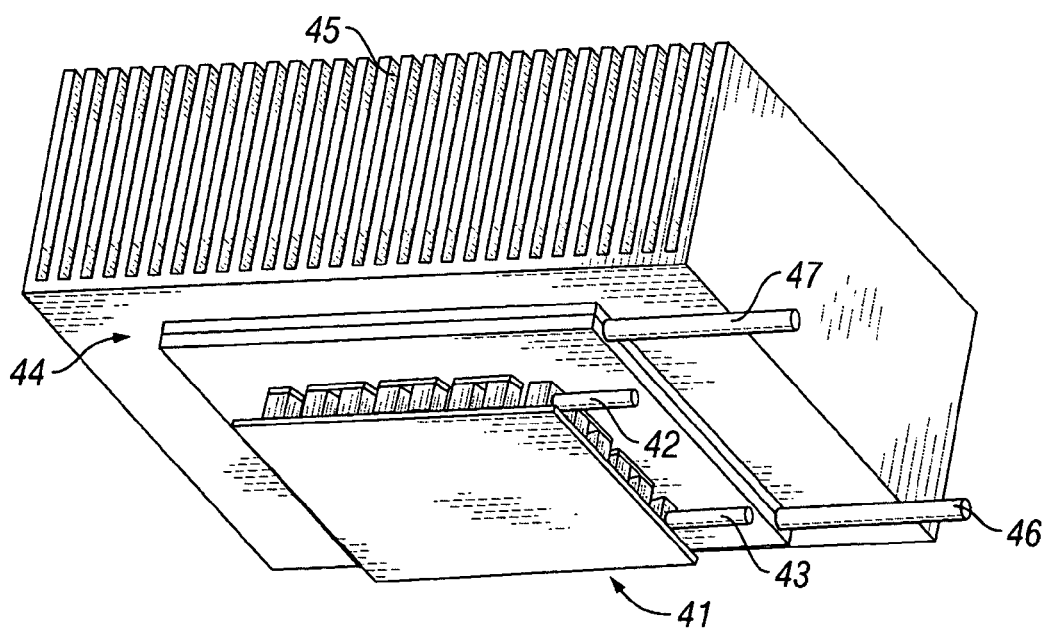
FIG. 4 shows a TEC-MHD cooling system in accordance with embodiments of the present invention.

FIG. 4 illustrates a cooling system in accordance with embodiments of the present invention. The TEC cooling component 41 is connected to a power supply through cables 42 and 43. The MHD component 44 transfers heat from the hot side of the TEC component 41 to a heat sink 45. MHD fluid (e.g., liquid or gas) flows in and out the MHD component 44 through the pipes 46 and 47.

Figure 5A:
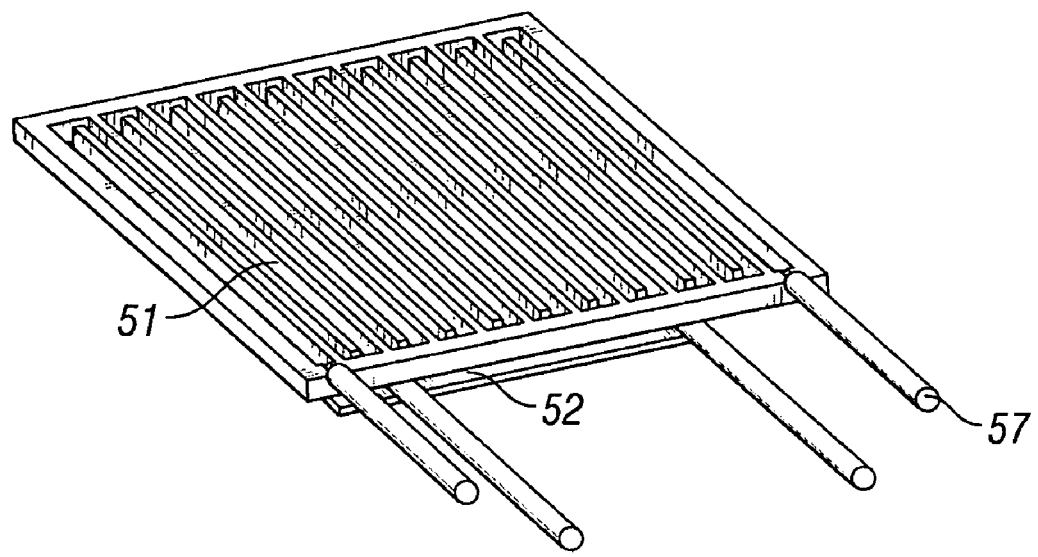
FIGS. 5A-5D show a structure of an MHD cooling component the physical principle of MHD cooling.
Figure 5B:
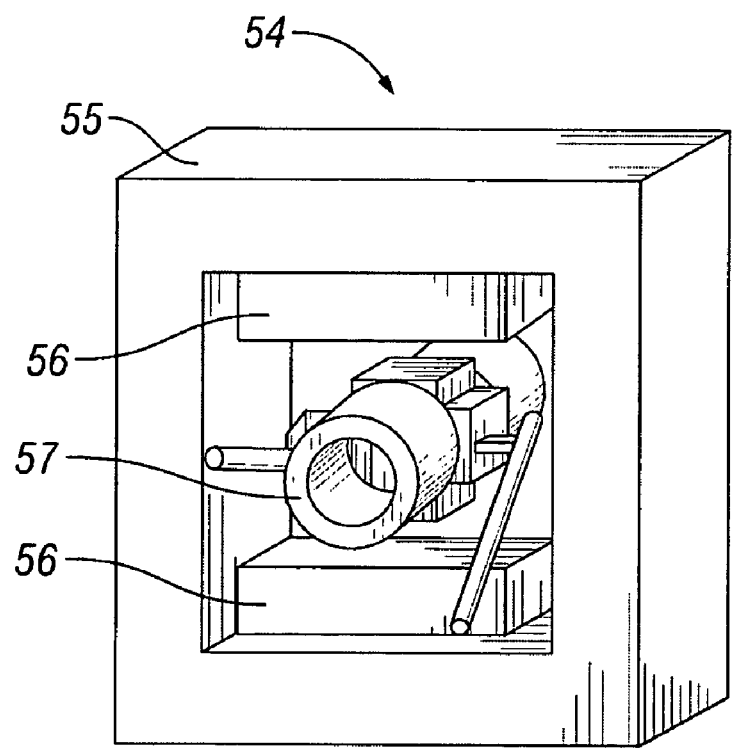
Figure 5C:
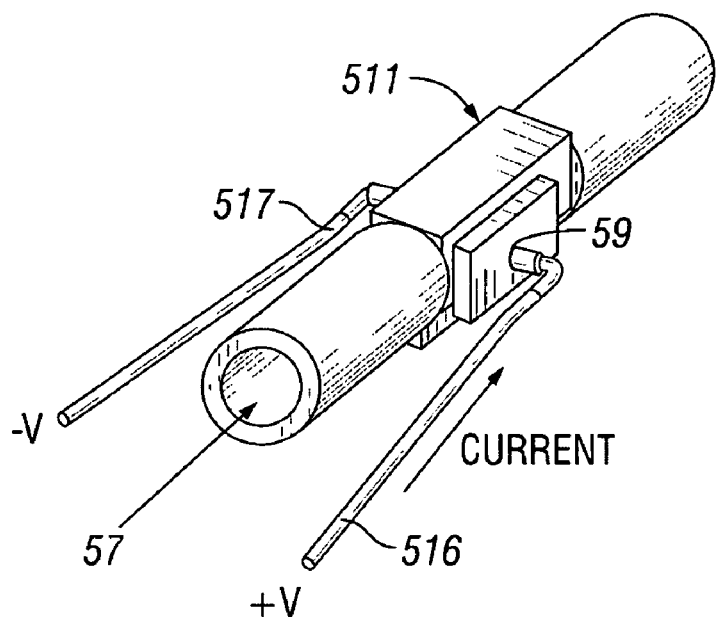
Figure 5D:
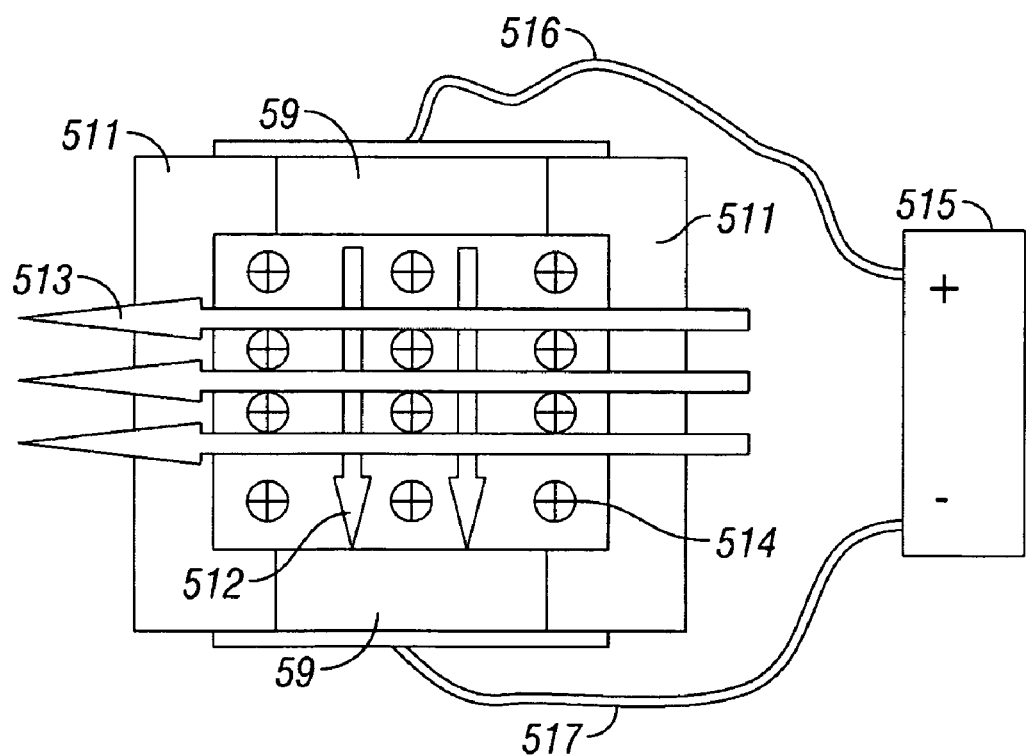

The configuration and working principle of an MHD component are illustrated in FIGS. 5A-5D. The MHD component 51 atop the TEC component 52 is connected to a MHD pump 54. The MHD pump 54 includes a yoke 55 in which magnets 56 and a copper pipe 57 are mounted. The magnets 56 generate a magnetic field in the direction shown as arrows 513. Copper conductor plates 59, separated by non-conductive segments 511, are connected to a power supply 515 using wires 516 and 517, and provide an electrical current to charged particles in the pipe 57. As shown in FIG. 5D, charged particles in the fluid inside the pipe 57 are driven by the electric field in the electrical current direction show as arrow 512, and are subsequently subject to the magnetic propulsion in the direction along the pipe shown as arrow symbols 514 in the direction toward inside the plane of the paper. The strength of the magnetic propulsion, F, is proportional to the strength of the magnetic field (B) and the velocity (v) of the charged particles in the direction of the electrical current shown in FIG. 5D. Consequently, F, expressed as $$F = v \times B,$$

may be effectively controlled with an amplitude of the electrical current through the copper conductor plates 59, and/or with the strength of the magnetic field. The strength of the magnetic field may also be controlled through an electrical current flowing in a coil that generates the magnetic field.

Figure 6A:
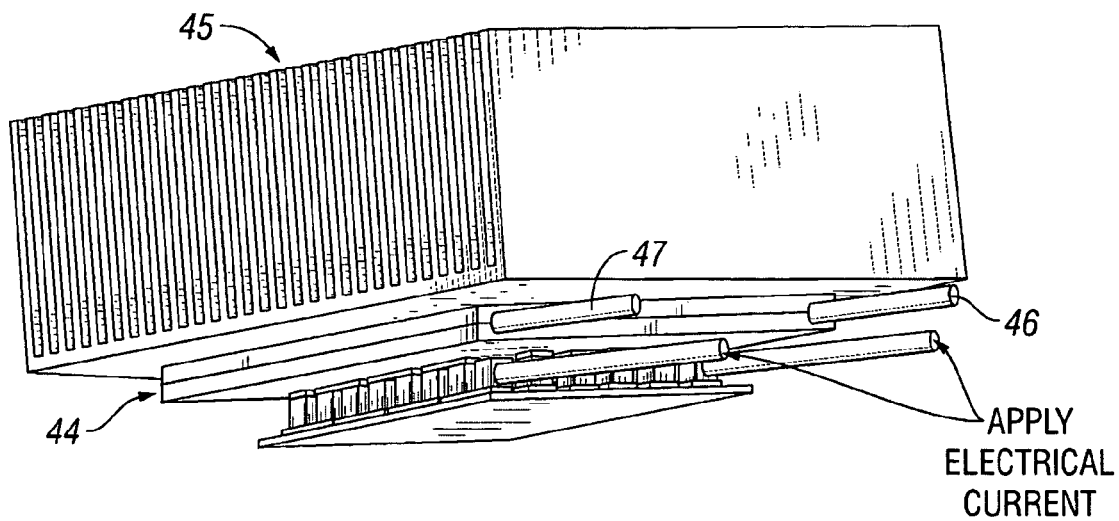
FIGS. 6A-6B shows perspective views of a TEC-MHD cooling system in accordance with embodiments of the present invention.
Figure 6B:
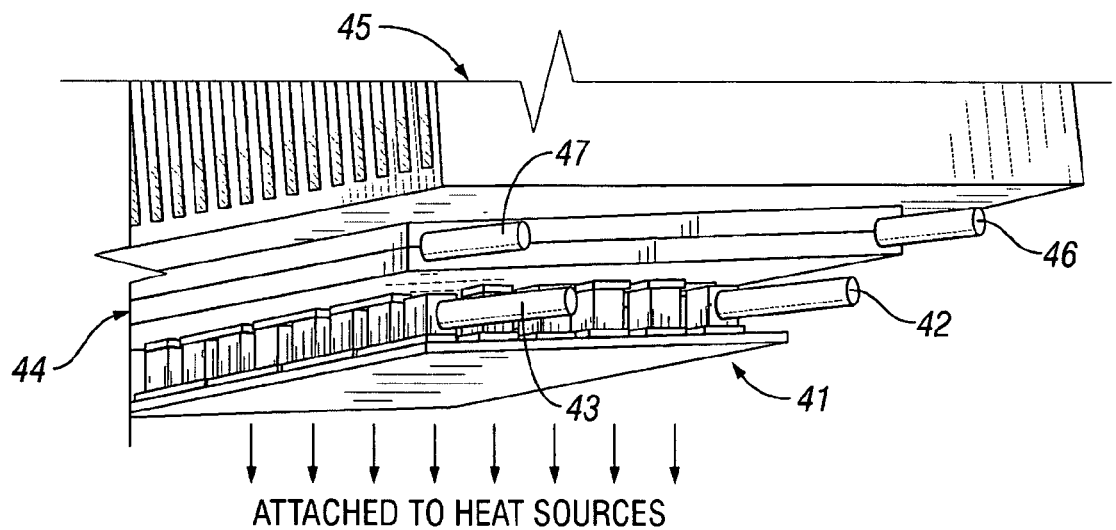

Perspective views for the TEC-MHD cooling system of FIG. 4 are further provided in FIG. 6. The TEC cooling component 41 is powered by a power supply through cables 42 and 43. The MHD component 44 transfers heat from the hot side of the TEC component 41 to a heat sink 45. MHD fluid flows in and out the MHD component 44 through the pipes 46 and 47. The fluid may be circuited in a closed circuit, driven by an MHD pump as illustrated in FIG. 5. The MHD pump may be powered by the same power supply for the TEC component, or using a different power supply.

Figure 7A:
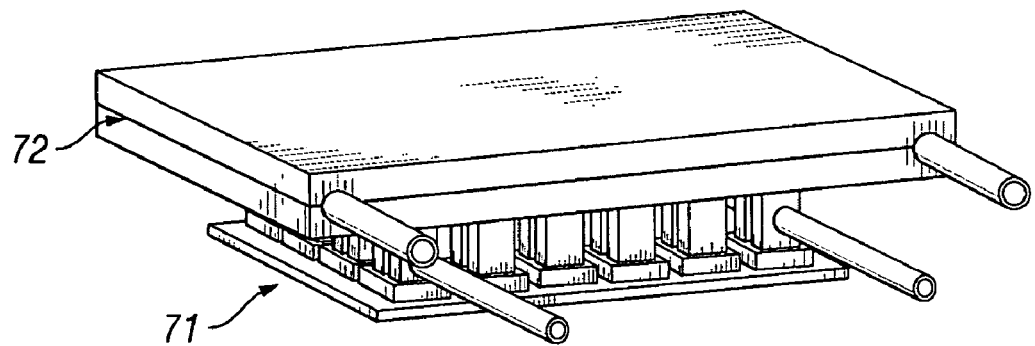
FIGS. 7A-7C shows a configuration of TEC components and MHD components of a cooling system in accordance with embodiments of the present invention.
Figure 7B:
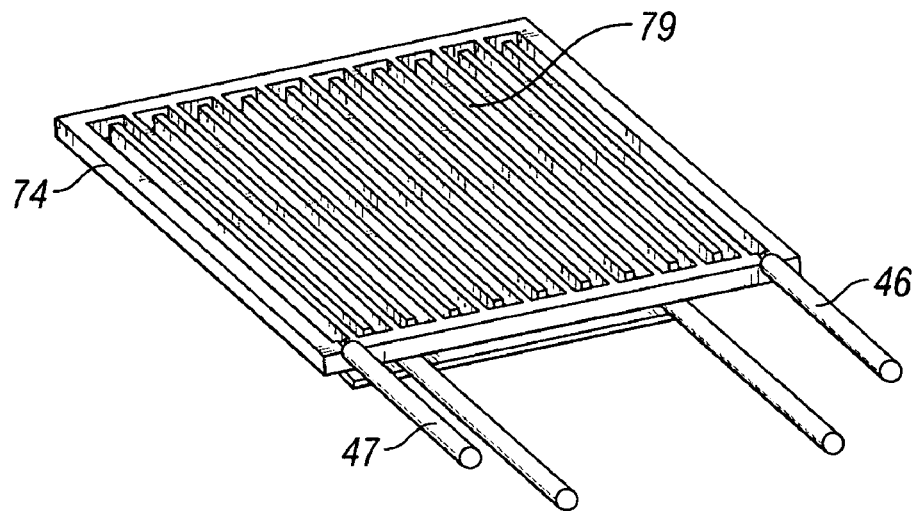
Figure 7C:
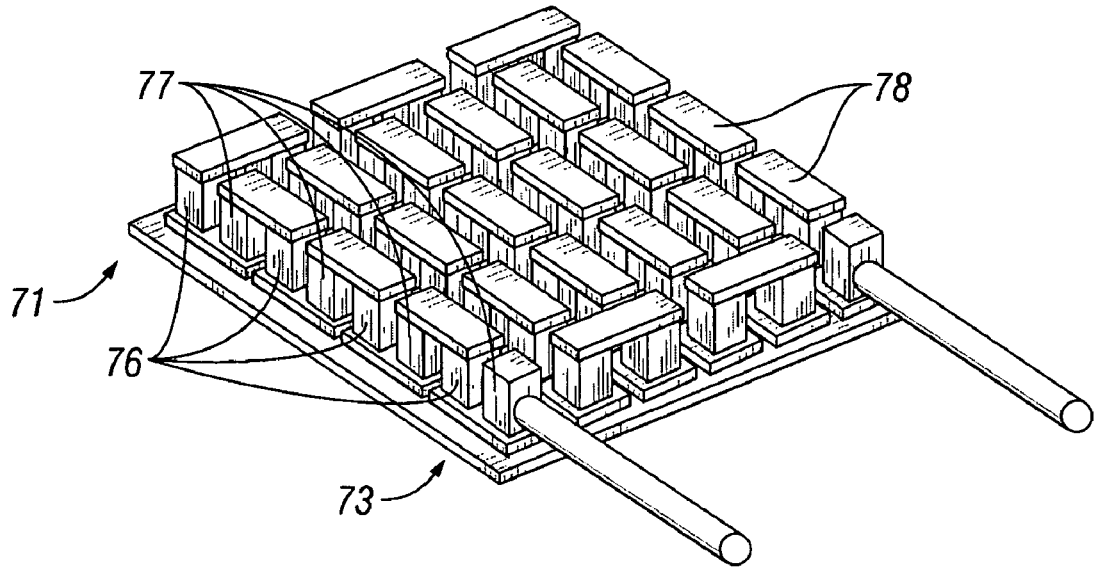

Turning now to FIG. 7, layered structure of a cooling system in accordance with embodiments of the present invention is presented. In the TEC component 71, a ceramic layer 73 is used as a substrate for the individual TEC modules. On the ceramic layer 73, a plurality of n-type TEC modules 76 and p-type TEC modules 77 are inter-connected using conductor plates 78. In accordance with some embodiments of the present invention, in MHD component 72, MHD channels 79 may be embedded inside a top ceramic layer 74 that serves as the thermal contact to the hot side of the TEC modules. The MHD channels are connected through pipes 46 and 47 to an external MHD pump, and optionally to a reservoir for MHD fluid, or to a heat sink at a distance from the TEC component.

Figure 8A:
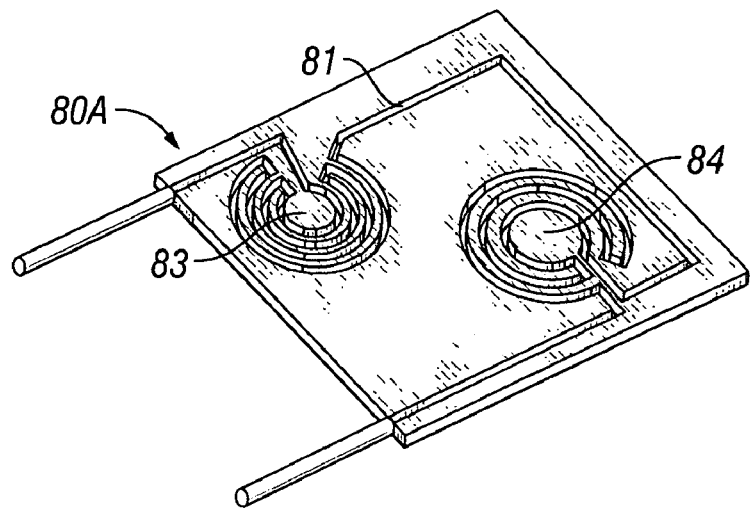
FIGS. 8A-8C illustrate embodiments of the MHD cooling component.
Figure 8B:
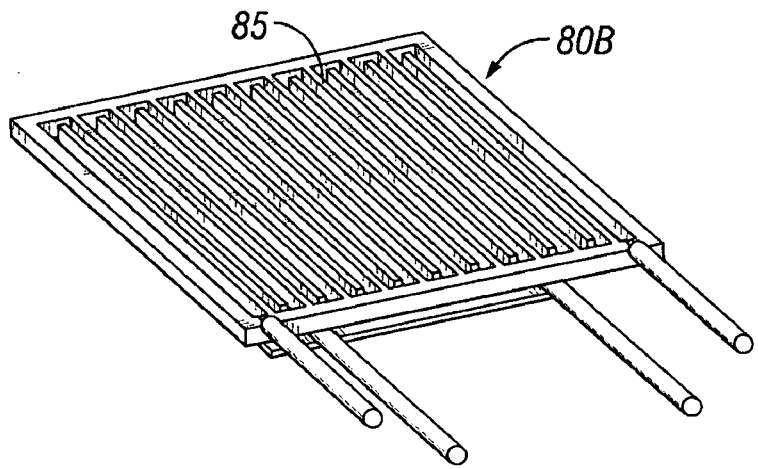
Figure 8C:
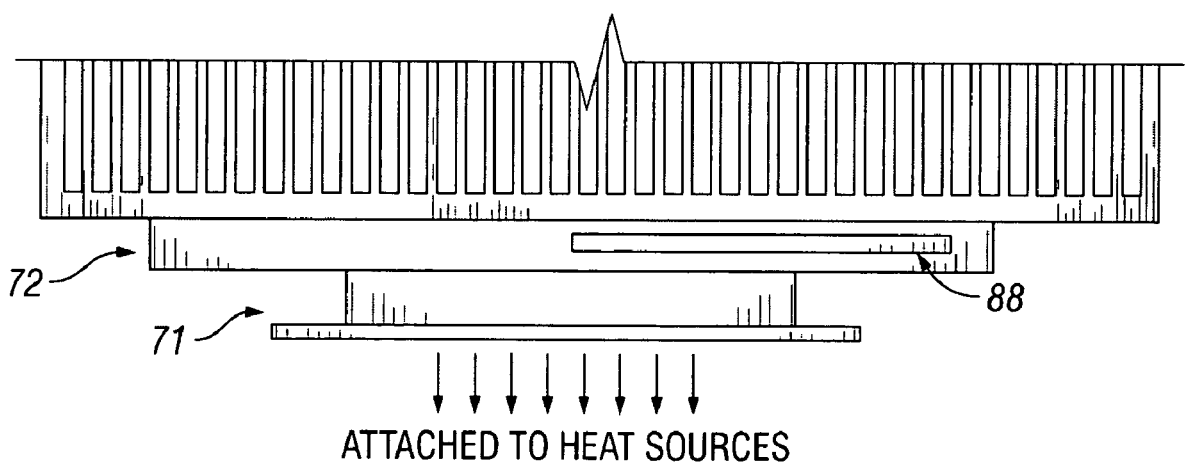

The MHD channels can have different topologies. Some embodiments of the present invention are illustrated in FIGS. 8A-8C. A channel in the ceramic layer may be lateral or vertical relative to the ceramic layer. An MHD component 72 may have a configuration shown in an embodiment of the MHD component 80a of FIG. 8A, wherein the channel 81 within the ceramic layer forms patterns that are localized around a location 83 and a location 84. Such a configuration can effectively remove heat from locations 83 and 84, which may correspond to projected "hot spots." In addition, heat may be transferred from one spot to another spot accurately along a channel pattern similar to that of FIG. 8A. As illustrated in FIG. 8B, channel patterns may be designed to be evenly distributed throughout another embodiment of the MHD component 80b in order to maximize the overall cooling efficiency. FIG. 8C shows a cross-sectional view of an MHD component, wherein channels 88 are in a lateral direction within the ceramic layer while forming patterns within the layer.

Figure 9:
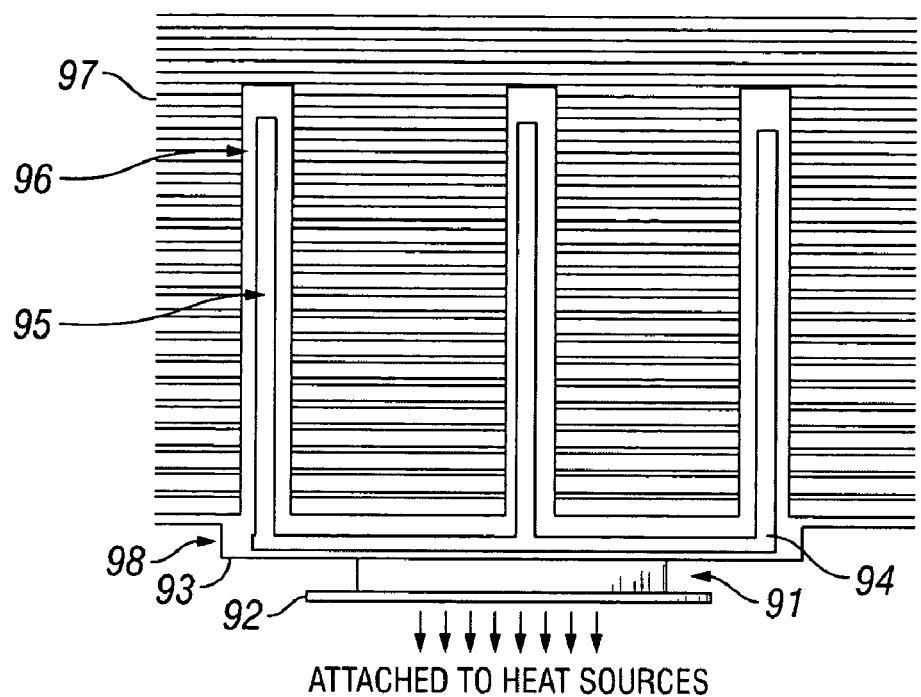
FIG. 9 illustrates an embodiment of an MHD cooling component with vertical MHD channels.

In accordance with embodiments of the present invention, the MHD channels can extend beyond the ceramic layer and into the heat sink. As shown in FIG. 9, TEC component 91 is disposed between a bottom ceramic layer 92 and a top ceramic layer 93, the bottom ceramic layer 92 being attached to heat sources to be cooled. For the MHD component 98, in addition to MHD channels 94 that are in a lateral direction relative to the ceramic layer 93, substantially vertical channels 95, defined by pipes 96, extend into the heat sink 97. Because the fluid carrying heat is in thermal contact with multiple fins of the heat sink 97, heat transfer rate greatly increased.

Figure 10A:
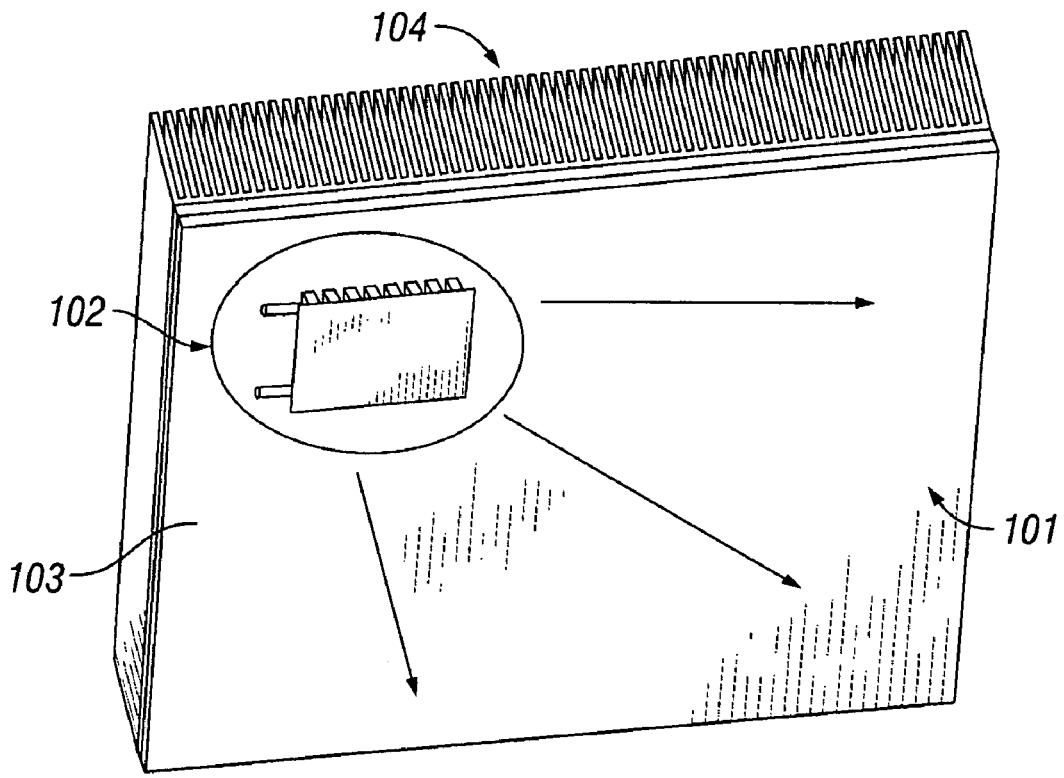

A system in accordance with one or more embodiments of the present invention includes an MHD component having a surface area significantly larger than that of a TEC component attached to it, as shown in FIG. 10. As the rate of heat dissipation is proportional to the surface area, a large MHD component 101 can transfer heat from a relatively small area of a small TEC component 102 and spread the heat to a large area. Because the heat is carried away by MHD fluid, the heat dissipation rate at the hot side of the TEC component 102 is not limited by the relatively small surface area. The heat transfer rate can be effectively adjusted by the ratio of the size of the MHD component to the size of TEC component. In addition, the heat can be effectively transferred to a large heat sink 104, further increasing heat dissipation area. Furthermore, in accordance with embodiments of the present invention, a large MHD component 106 can effectively cool a plurality of small TEC devices 107-109, as shown in FIG. 10B.

In accordance with some embodiments of the present invention, a plurality of TEC and MHD components may be adjoined in a cascade configuration, as shown in an exemplary configuration in FIG. 11. The heat is transferred from a heat source to a first TEC component 111. Heat from the hot side of the first TEC component 111 is further transferred, through an MHD component 112, to a second TEC component 113. A plurality of MHD channels 114 may be confined to between two TEC components. Alternatively, in accordance with some embodiments of the present invention, the MHD channels may go through one or more TEC components, in which holes are designed to be adapted to have MHD channels disposed therethrough. The heat transfer efficiency can be significantly improved compared to conventional, serially-connected TEC components. This is due to the fact that in a conventional configuration the ceramic layers between the TEC components are bottlenecks for heat transfer.

Figure 1:
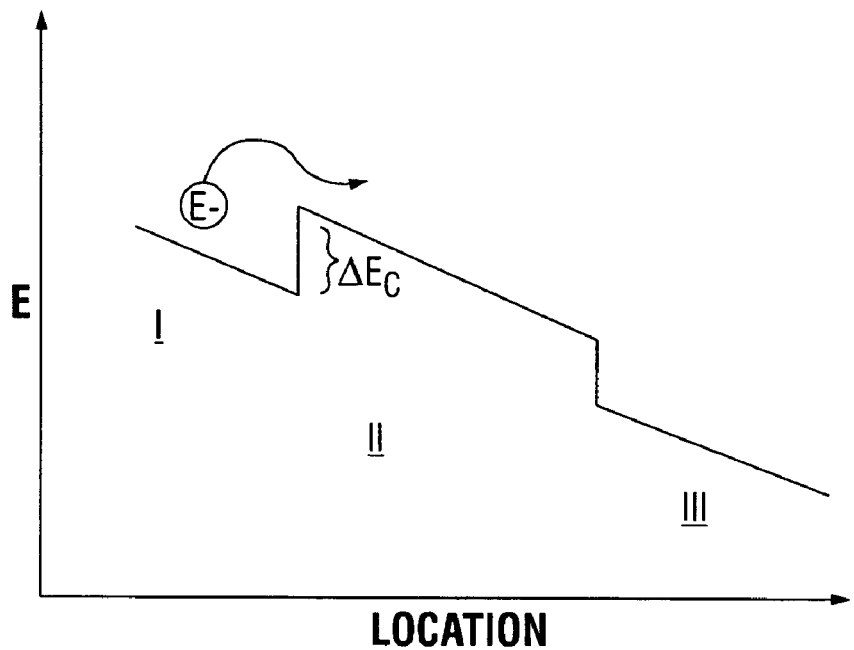
FIG. 1 illustrates the principle for a TEC cooling process.
Figure 2A:
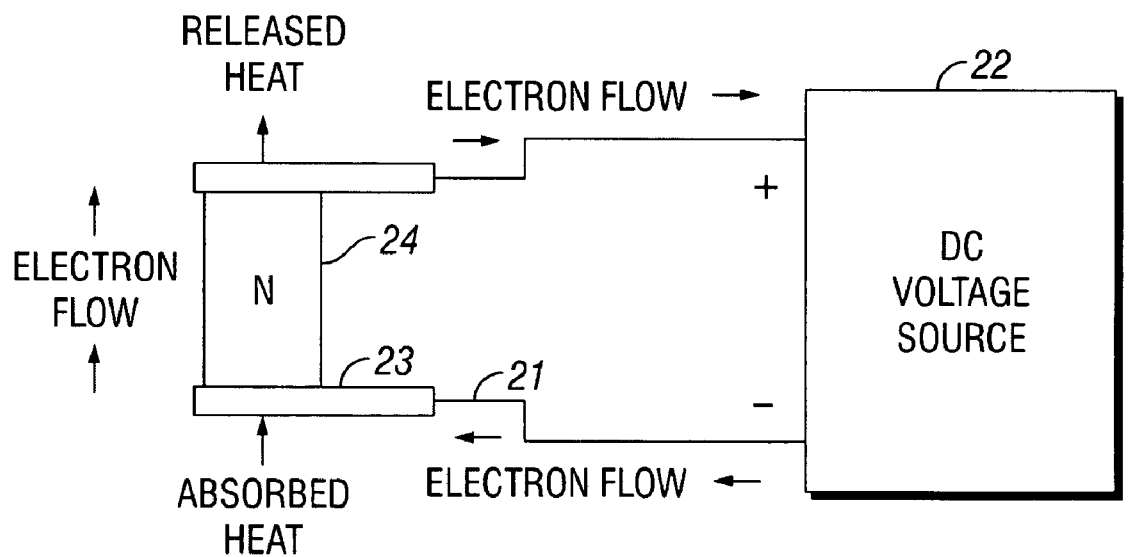
FIG. 2A shows a simple form of a TEC module made of an n-type semiconductor pellet.
Figure 2B:
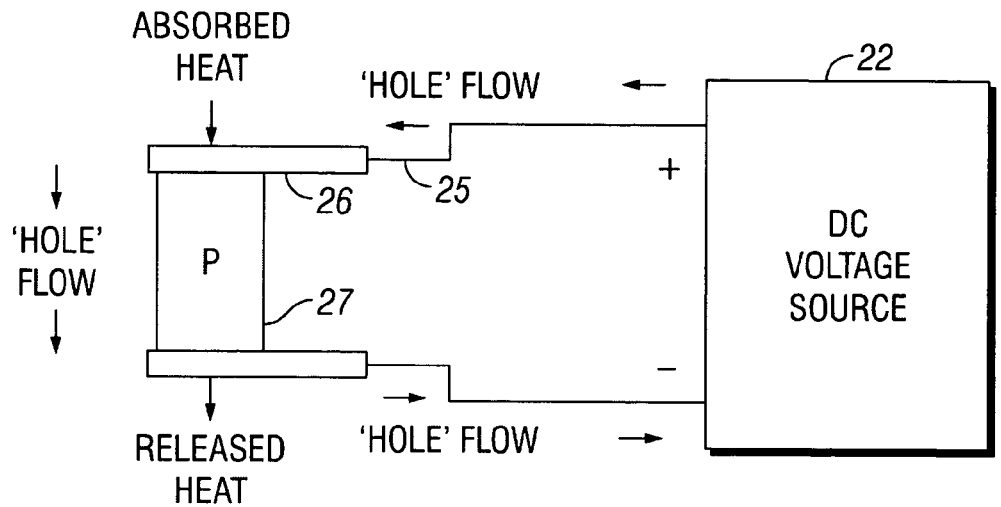
FIG. 2B shows a simple form of a TEC module made of an p-type semiconductor.
Figure 3A:
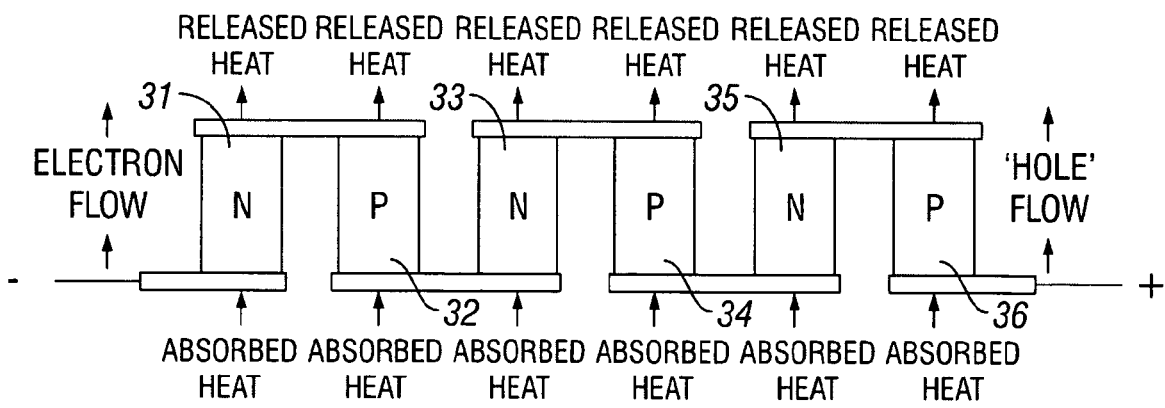
FIG. 3A illustrates a TEC device made of coupled n-type and p-type pellets.
Figure 3B:
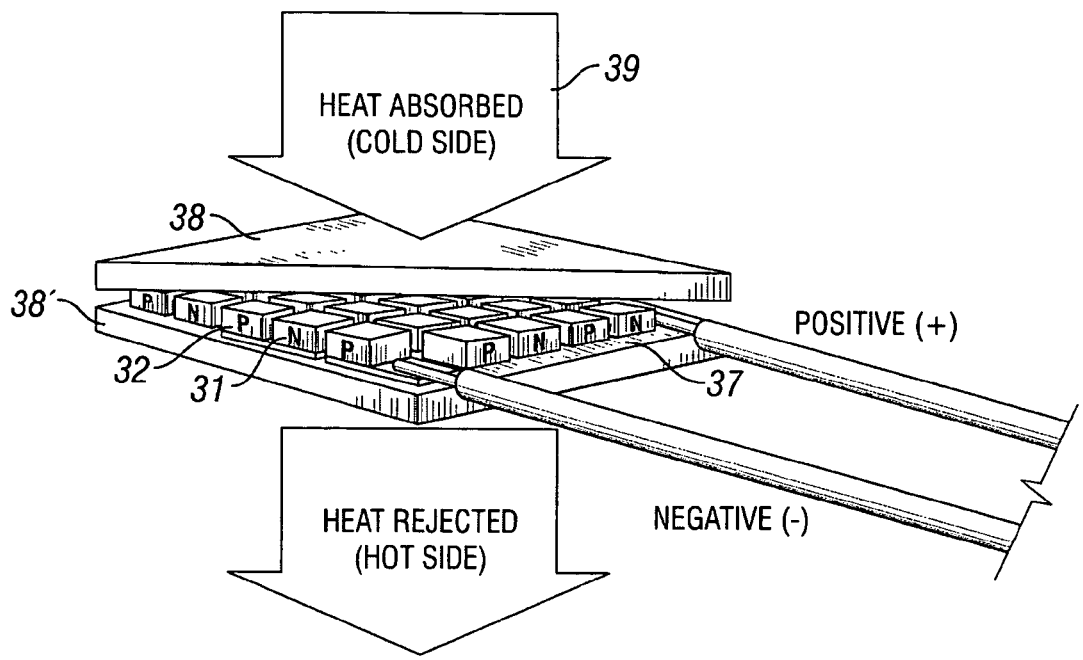
FIG. 3B illustrates a practical TEC device including a 2-D array of a plurality of n-type and p-type modules.
Figure 11C:
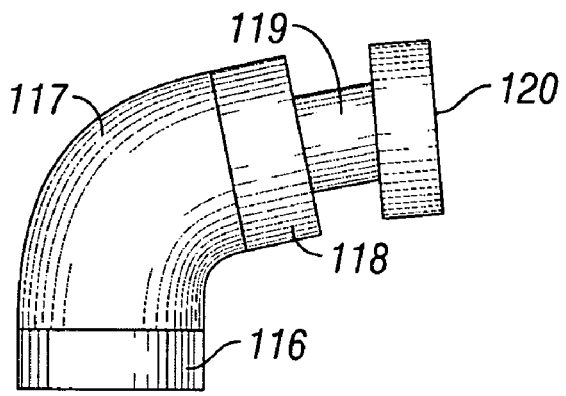

In accordance with some embodiments of the present invention, the exemplary system illustrated in FIG. 11A may have many variations in its configuration. For example, the MHD components may have different shapes, such as square, circular, or tubular shapes. In addition, the fluid channels may also have different shapes, sizes, locations and configuration. The MHD components connecting TEC components may have shapes that effectively direct heat transfer to a different direction. For example, as illustrated in FIG. 11C, an embodiment of the cooling system may include a TEC component 116, and a "bent" MHD component 117, the direction of heat transfer may be pointed to a direction away from the direction perpendicular to the first TEC component 116, i.e., away from the arrows shown in FIG. 1A. The MHD component 117 may be further connected to a TEC component 118, as well as other MHD components (such as 119) and TEC components (such as 120). Further, in accordance with embodiments of the present invention, one or more of the MHD components, such as 117, may be made of a flexible material. Accordingly, MHD pipes within the MHD component 117 is made flexible. Thus, serially-connected TEC-MHD components may form a heat transfer path having a flexible shape, allowing heat to be transferred accurately from one spot to another spot in any direction.

Figure 12A:
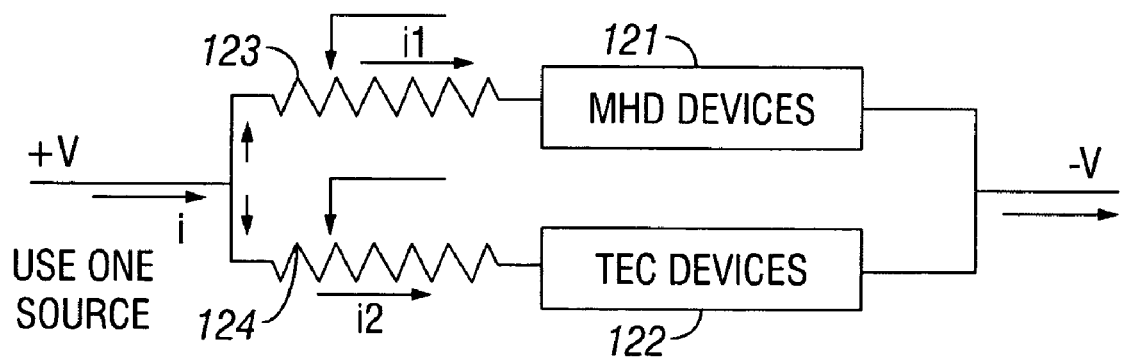
FIGS. 12A-12B shows circuitry of TEC-MHD cooling systems in accordance with embodiments of the present invention.

An MHD component 121 and a TEC component 122 may be powered by a same power supply, as shown in FIG. 12A. As the heat transfer rate is proportional to the current amplitude, optionally separate current controllers 123 and 124 may be used to control currents i1 and i2 to the MHD component 121 and the TEC component 122, respectively.

Figure 12B:
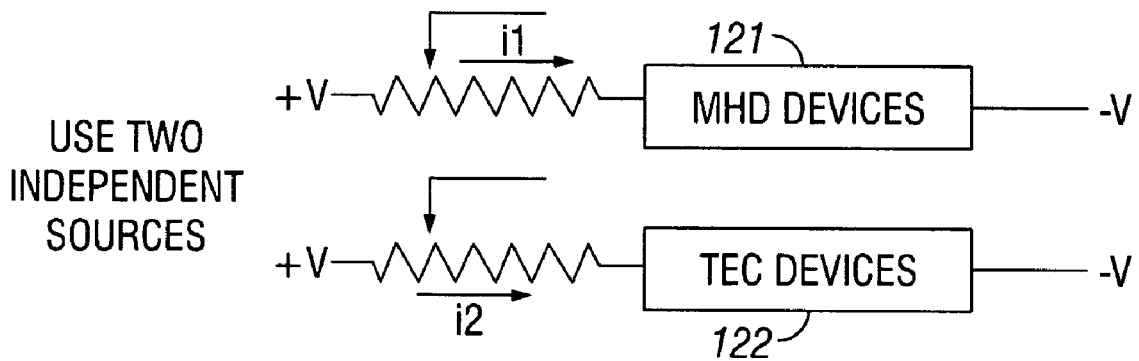

Alternatively, separate power supplies may be used to control the MHD component 121 and the TEC 122 component individually, as illustrated in FIG. 12B.

Figure 13:
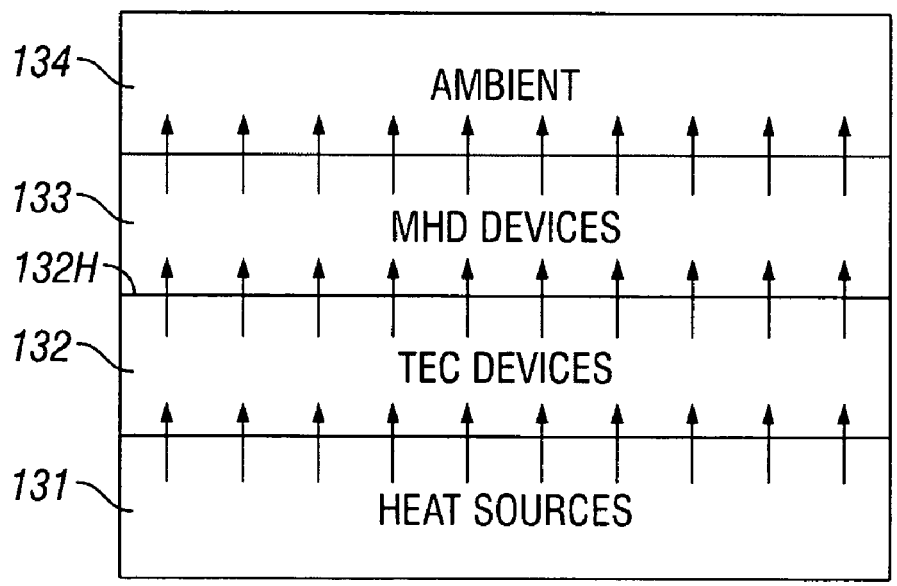
FIG. 13 illustrates a TEC-MHD cooling system with a controlled heat transfer rate across different components in accordance with embodiments of the present invention.

One or more embodiments of the present invention provide efficient heat transfer and effective ways of controlling the heat transfer rates. As illustrated in FIG. 13, heat is transferred from a heat source 131, to a hot side 132h of a TEC device 132. The heat transfer rate may be controlled by, for example, the magnitude of the electrical current flowing into the TEC component 132. Heat is further transferred from the TEC device 132 to the MHD device 133, and the heat transfer rate therein may be controlled by, for example, the flow rate of the MHD fluid. As discussed earlier, in addition to controlling the heat transfer rate, the direction for the heat transfer may also be controlled, for example, by using a "bent" or a flexible MHD component. Thus, the direction for the heat transfer may be changed to be different from the vertical arrows seen in FIG. 13.

Heat may be further transferred from the MHD device 133 to a second location, e.g., the ambient environment 134. The heat transfer rate therein may be controlled through the size of a heat sink, cooling fans, and/or other conventional means.

Advantages of one or more embodiments of the present invention may include, but are not limited to: efficient cooling without mechanical moving parts; compact design; controllable cooling rate; flexible direction of heat transfer; accurate transfer of heat from one spot to another.

While the invention has been described with respect to a limited number of embodiments, those skilled in the art, having benefit of this disclosure, will appreciate that other embodiments can be advised which do not depart from the scope of the invention as disclosed herein. Accordingly, the scope of the invention should be limited only by the attached claims.

What is claimed is:

1. A method for transferring heat from a first location to a second location, comprising:

thermoelectrically transferring heat from the first location to a third location and from a fourth location to the second location using a first array of thermoelectric cooling (TEC) modules and a second array of TEC modules, respectively; and transferring heat from the third location to the fourth location through a magneto-hydrodynamic (MHD) flow, wherein a portion of the MHD flow is disposed through a channel penetrating the second 2-D array of TEC modules along a substantially perpendicular direction to the 2-D array of the TEC modules.

2. The method of claim 1, wherein a first heat transfer rate of thermoelectrically transferring heat is controlled through an amplitude of an electrical current to the first array of TEC modules.

3. The method of claim 1, wherein a second heat transfer rate of transferring heat from the third location to the fourth location is controlled through a flow rate of the MHD flow.

4. The method of claim 3, wherein the flow rate of the MHD flow is controlled through at least one of a strength of a magnetic field and an amplitude of an electrical current to an MHD pump.

5. The method of claim 1, wherein a second heat transfer rate of transferring heat from the third location to the fourth location is controlled through a ratio of a size of a surface area of an MHD component conducting the MHD flow to a size of a surface area of the first array of TEC modules.

6. A cooling system, comprising:
 a first 2-D array of thermoelectric cooling (TEC) modules and a second 2-D array of TEC modules; and
 a magnetohydrodynamic (MHD) component comprising a MHD channel and an MHD pump for pumping MHD fluid through the MHD channel,
 wherein the MHD component is in thermal contact with a hot side of the first 2-D array of TEC components and a cold side of the second 2-D array of TEC components, and
 wherein a portion of the MHD channel penetrates the second 2-D array of TEC modules along a substantially perpendicular direction to the 2-D array of the TEC modules.

7. The cooling system of claim 6, further comprising a power supply for supplying electrical currents to both the TEC components and the MHD component.

8. The cooling system of claim 6, further comprising a power supply for supplying an electrical current to the TEC components and a power supply for supplying an electrical current to the MHD component.

9. The cooling system of claim 6, wherein the MHD component is in thermal contact with the second 2-D array of TEC modules via a heat sink including a plurality of fins, wherein a portion of the MHD channel is disposed in thermal contact with the plurality of fins of the heat sink.

10. The cooling system of claim 6, wherein the MHD component is adapted for transferring heat from the first array of TEC modules in a direction different from a direction in which the second array of TEC modules transfers heat.

11. The cooling system of claim 6, wherein the MHD component comprises a flexible material and is adapted to be flexible in heat transfer directions.

\* \* \* \* \*